(12) United States Patent
Liu et al.

(10) Patent No.: US 9,859,193 B2
(45) Date of Patent: Jan. 2, 2018

(54) PACKAGE STRUCTURE

(71) Applicant: IBIS Innotech Inc., Taichung (TW)

(72) Inventors: Wen-Chun Liu, Taichung (TW); Wei-Jen Lai, Taichung (TW)

(73) Assignee: IBIS Innotech Inc., Taichung (TW)

( * ) Notice: Subject to any disclaimer, the term of this patent is extended or adjusted under 35 U.S.C. 154(b) by 0 days.

(21) Appl. No.: 15/600,793

(22) Filed: May 22, 2017

(65) Prior Publication Data

US 2017/0256479 A1    Sep. 7, 2017

Related U.S. Application Data

(63) Continuation-in-part of application No. 15/461,499, filed on Mar. 17, 2017, which is a continuation-in-part of application No. 15/232,808, filed on Aug. 10, 2016, now Pat. No. 9,801,282, which is a continuation-in-part of application No. 14/663,447, filed on Mar. 19, 2015, now Pat. No. 9,451,694.

(30) Foreign Application Priority Data

Jun. 24, 2014 (TW) .............................. 103121829 A
Jan. 11, 2017 (TW) .............................. 106100819 A
Mar. 28, 2017 (TW) .............................. 106110222 A

(51) Int. Cl.
*H01L 23/495* (2006.01)
*H01L 23/60* (2006.01)

(52) U.S. Cl.
CPC .... *H01L 23/49503* (2013.01); *H01L 23/4952* (2013.01); *H01L 23/49524* (2013.01); *H01L 23/49537* (2013.01); *H01L 23/49558* (2013.01); *H01L 23/60* (2013.01)

(58) Field of Classification Search
CPC ......... H01L 23/49503; H01L 23/49558; H01L 23/49537; H01L 23/49524; H01L 23/4952; H01L 23/60
USPC ........................................ 257/666, 684, 696
See application file for complete search history.

(56) References Cited

U.S. PATENT DOCUMENTS

| | | | | |
|---|---|---|---|---|
| 6,727,576 B2 * | 4/2004 | Hedler | .................. | H01L 21/561 257/675 |
| 7,554,184 B2 * | 6/2009 | Webster | ............ | H01L 27/14618 257/680 |
| 7,618,846 B1 * | 11/2009 | Pagaila | .................. | H01L 21/568 257/E21.599 |

(Continued)

OTHER PUBLICATIONS

Korczynski, "Wafer-level packaging of ICs for mobile systems of the future," Semiconductor Manufacturing & Designs Community, May 2014, pp. 1-5.

*Primary Examiner* — Alexander Oscar Williams
(74) *Attorney, Agent, or Firm* — JCIPRNET

(57) ABSTRACT

A package structure including a substrate, a first lead frame, a first metal layer, at least one chip, a base and a second metal layer is provided. The base includes a plurality of openings. The first lead frame is embedded in the substrate and includes a plurality of first pads, where the openings expose the first pads. The first metal layer covers the exposed first pads. The chip is disposed on the substrate and electrically connected to the first metal layer and the first pads. The base covers the substrate with its bonding surface. The second metal layer covers a base surface of the base.

25 Claims, 8 Drawing Sheets

(56) References Cited

U.S. PATENT DOCUMENTS

| | | | | |
|---|---|---|---|---|
| 7,646,429 B2* | 1/2010 | Webster | ............... | H04N 5/2253 |
| | | | | 348/374 |
| 8,076,184 B1* | 12/2011 | Camacho | ................ | H01L 24/29 |
| | | | | 257/E21.499 |
| 9,000,584 B2* | 4/2015 | Lin | ........................ | H01L 24/19 |
| | | | | 257/737 |
| 9,685,889 B2* | 6/2017 | Horie | ..................... | H02N 2/001 |
| 9,752,908 B2* | 9/2017 | Tashiro | ................. | G01F 1/6842 |
| 2006/0006504 A1* | 1/2006 | Lee | .................... | H01L 21/4846 |
| | | | | 257/666 |
| 2006/0125042 A1* | 6/2006 | Fuergut | .............. | H01L 23/3128 |
| | | | | 257/499 |
| 2007/0126081 A1* | 6/2007 | Webster | ............ | H01L 27/14618 |
| | | | | 257/565 |
| 2007/0126916 A1* | 6/2007 | Webster | ............... | H04N 5/2253 |
| | | | | 348/340 |
| 2008/0073768 A1* | 3/2008 | Shiraishi | ................ | B81B 7/007 |
| | | | | 257/684 |
| 2010/0127372 A1* | 5/2010 | Holland | .................. | H01L 24/14 |
| | | | | 257/685 |
| 2011/0156176 A1* | 6/2011 | Huckabee | ............ | B81B 7/0061 |
| | | | | 257/414 |
| 2012/0139090 A1* | 6/2012 | Kim | ....................... | H01L 25/16 |
| | | | | 257/659 |
| 2013/0156058 A1* | 6/2013 | Yamashita | ............ | H01L 33/486 |
| | | | | 372/44.01 |
| 2014/0070329 A1* | 3/2014 | Flores | .................... | H01L 24/37 |
| | | | | 257/401 |
| 2017/0256479 A1* | 9/2017 | Liu | ................... | H01L 23/49503 |

* cited by examiner

PACKAGE STRUCTURE

CROSS-REFERENCE TO RELATED APPLICATION

This is a continuation-in-part application of and claims the priority benefit of U.S. patent application Ser. No. 15/461,499, filed on Mar. 17, 2017, which claims the priority benefit of Taiwan patent application serial no. 106100819, filed on Jan. 11, 2017. The prior patent application Ser. No. 15/461,499 is a continuation-in-part application of and claims the priority benefit of U.S. patent application Ser. No. 15/232,808, filed on Aug. 10, 2016. The prior patent application Ser. No. 15/232,808 is continuation-in-part application of patent application Ser. No. 14/663,447, filed on Mar. 19, 2015, now patented as U.S. Pat. No. 9,451,694, issued on Sep. 20, 2016, which claims the priority benefit of Taiwan patent application serial no. 103121829, filed on Jun. 24, 2014. This application also claims the priority benefit of Taiwan patent application serial no. 106110222, filed on Mar. 28, 2017. The entirety of each of the above-mentioned patent applications is hereby incorporated by reference herein and made a part of this specification.

BACKGROUND

Technical Field

The disclosure relates to a package structure, and particularly relates to a package structure of a chip.

Description of Related Art

Along with development of technology, electronic products are all developed toward a trend of lightweight and miniaturization. Taking microphones as an example, microelectromechanical systems (MEMS) sensors have been widely applied in such domain. The conventional microphone includes a MEMS sensor, a driving chip used for driving the MEMS sensor and a circuit board used for carrying the MEMS sensor and the driving chip. Besides a conductive layer and a dielectric layer, the circuit board further has a plurality of conductive vias, and the driving chip in the microphone is generally electrically connected to the conductive vias.

In the conventional technique, a manufacturer may first manufacture a sensing device and the circuit board used for carrying electronic devices. Then, the sensing device is packaged on the circuit board to form a sensing device package structure. However, such method is not only time-consuming and labor-consuming, but also an overall thickness of the sensing device package structure is not easy to be decreased. Therefore, how to ameliorate the existing sensing device package structure is one of the targets to be achieved by related practitioners.

SUMMARY

The disclosure is directed to a package structure, which is manufactured through simplified process steps, and production cost thereof is decreased and a circuit pitch thereof is reduced.

The disclosure provides a package structure including a substrate, a first lead frame, a first metal layer, at least one chip, a base and a second metal layer. The substrate includes a plurality of openings. The first lead frame is embedded in the substrate and includes a plurality of first pads, where the openings expose the first pads. The first metal layer covers the exposed first pads. The chip is disposed on the substrate and electrically connected to the first metal layer and the first pads. The base covers the substrate with a bonding surface. The second metal layer covers a base surface of the base.

In an embodiment of the disclosure, the base further includes a receiving cavity, and the chip is located in the receiving cavity.

In an embodiment of the disclosure, a material of the base and the substrate includes epoxy, diallyl phthalate (DAP), benzocyclobutene (BCB), polyester, acrylate, fluorine polymer, polyphenylene oxide, polyimide, phenolic resin, polysulfone, silicon polymer, bismaleimide-triazine modified epoxy resin, cyanate polyester, polyethylene, polycarbonate resin, acrylonitrile-butadiene-styrene copolymer, polyethylene terephthalate (PET), polybutylene terephthalate (PBT), liquid crystal polyester (LCP), polyamide (PA), nylon 6, polyformaldehyde (POM), polyphenylene sulfide (PPS), polycarbonate (PC), polymethacrylate (PMMA), acrylonitrile butadiene styrene (ABS) resin or cyclic olefin copolymer (COC).

In an embodiment of the disclosure, a material of the base and the substrate does not include a metal oxide complex suitable for being activated by laser, plasma or a mechanical cutting tool to implement metallized coating.

In an embodiment of the disclosure, the package structure further includes a second lead frame embedded in the base.

In an embodiment of the disclosure, the substrate further includes a plurality of electrode contacts, and the base includes a first electrode and a first conductive via, and the first electrode is disposed on the bonding surface and electrically connected to the electrode contacts.

In an embodiment of the disclosure, the second metal layer includes a first trench and a circuit, the circuit is connected to the first conductive via and the first electrode, the first trench surrounds the first conductive via, the first electrode and the circuit, such that the first conductive via, the first electrode and the circuit are electrically isolated from the rest of the second metal layer, where an upper surface of a part of the base exposed by the first trench is lower than the base surface.

In an embodiment of the disclosure, the package structure further includes a second lead frame embedded in the base, and the second lead frame includes a plurality of external pads electrically connected to the chip and exposed outside the base.

In an embodiment of the disclosure, the second metal layer further includes a plurality of external pads disposed on an outer surface of the base facing away from the substrate and electrically connected to the first conductive via.

In an embodiment of the disclosure, the second metal layer further includes a plurality of external pads disposed on an outer surface of the base facing away from the substrate and electrically connected to the first conductive via, and a surface of the external pads is lower than the outer surface of the base.

In an embodiment of the disclosure, the substrate further includes a through hole penetrating through the substrate and the first lead frame to expose a part of the chip.

In an embodiment of the disclosure, the package structure further includes a second conductive via, and the base further includes a second electrode disposed on the bonding surface and electrically connected to one of the electrode contacts, the second conductive via is electrically connected to the second lead frame, and the rest of the second metal layer covers and electrically connects the second conductive via and the second electrode.

In an embodiment of the disclosure, the rest of the second metal layer is connected to a ground electrode.

In an embodiment of the disclosure, the first metal layer covers a substrate surface of the substrate and the openings, and includes a plurality of second trenches respectively surrounding the openings, such that the first pads are electrically isolated from the rest of the first metal layer, where an upper surface of a part of the substrate exposed by the second trench is lower than the substrate surface.

In an embodiment of the disclosure, the first lead frame includes a plurality of external pads electrically connected to the chip and exposed outside the substrate.

In an embodiment of the disclosure, the first metal layer further includes a plurality of external pads disposed on an outer surface of the substrate facing away from the base and electrically connected to the chip.

In an embodiment of the disclosure, the second metal layer further includes a plurality of external pads disposed on an outer surface of the base facing away from the substrate and electrically connected to the chip, and a surface of the external pads is lower than the outer surface of the base.

In an embodiment of the disclosure, the substrate further includes a device receiving cavity, and the chip and the first pads are disposed in the device receiving cavity.

In an embodiment of the disclosure, the rest of the first metal layer is connected to a ground electrode.

In an embodiment of the disclosure, the chip is electrically connected to the first pads through wire bonding.

In an embodiment of the disclosure, the chip is electrically connected to the first pads through flip-chip bonding.

In an embodiment of the disclosure, the first lead frame further includes a second pad, one of the openings exposes the second pad, and the second pad is electrically connected to the chip and the rest of the first metal layer.

In an embodiment of the disclosure, the package structure further includes a first metal layer, the substrate includes a plurality of openings exposing a plurality of the first pads of the first lead frame, and the first metal layer covers the opening and the first pads.

In an embodiment of the disclosure, the chip is electrically connected to the first pads through wire bonding.

In an embodiment of the disclosure, the chip is electrically connected to the first pads through flip-chip bonding.

In an embodiment of the disclosure, the first metal layer further includes a ground ring and a ground circuit, the ground ring surrounds a periphery of the substrate, the first lead frame further includes a second pad electrically connected to the chip, and the ground circuit is electrically connected to the second pad and the ground ring.

In an embodiment of the disclosure, the substrate further includes a device receiving cavity, the chip, the first pads and the second pad are disposed in the device receiving cavity, the ground ring surrounds the device receiving cavity, and the ground circuit extends on an inner wall of the device receiving cavity to connect the second pad and the ground ring.

In an embodiment of the disclosure, a material of the base includes a metal oxide complex suitable for being activated by laser, plasma or a mechanical cutting tool to implement metallized coating.

In an embodiment of the disclosure, a material of the metal oxide complex includes zinc, copper, silver, gold, nickel, palladium, platinum, cobalt, rhodium, iridium, indium, iron, manganese, aluminum, chromium, tungsten, vanadium, tantalum, titanium or any combination thereof.

In an embodiment of the disclosure, a lower surface of the first metal layer is lower than a substrate surface of the substrate.

In an embodiment of the disclosure, the package structure further includes a second lead frame, where the second lead frame includes a plurality of external pads electrically connected to the chip and exposed outside the base, and the first trench surrounds the external pads, such that the external pads is electrically isolated from the rest of the second metal layer.

In an embodiment of the disclosure, the first lead frame includes a plurality of external pads electrically connected to the chip and exposed outside the substrate, and the second trench surrounds the external pads, such that the external pads is electrically isolated from the rest of the second metal layer.

In an embodiment of the disclosure, the substrate further includes a through hole penetrating through the substrate and the first lead frame to expose a part of the chip.

According to the above description, in view of the package structure of the disclosure, a laser is first adopted to form a plurality of openings on the substrate to expose a plurality of pads of the lead frame embedded in the substrate, such that the chip disposed on the substrate may be electrically connected to the exposed pads. Therefore, according to the embodiment of the disclosure, the manufacturing process of the package structure may be effectively simplified to improve process efficiency. Moreover, the package structure formed based on the above manufacturing process is unnecessary to add a metal oxide that may be activated by laser, plasma or mechanical cutting tool in the base and/or the substrate, such that production cost may be decreased.

Besides, the base and the substrate of the disclosure may be shaped through a molding method, so that a thickness thereof and a shape thereof have larger design flexibility. Therefore, regarding the package structure of the disclosure, not only design flexibility thereof is improved, it may also easily comply with a fine circuit standard, and process steps thereof may be effectively simplified and the production cost and the overall thickness of the package structure are decreased.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
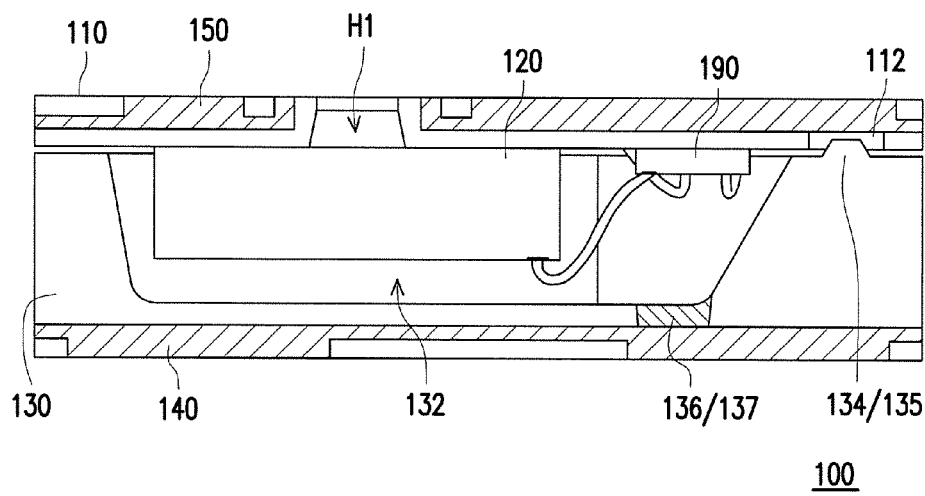
FIG. 1 is a cross-sectional view of a package structure according to an embodiment of the disclosure.

The present disclosure will now be described more fully with reference to the accompanying drawings, in which exemplary embodiments of the disclosure are shown. The terms used herein such as "above", "below", "front", "back", "left" and "right" are for the purpose of describing directions in the figures only and are not intended to be limiting of the disclosure. Moreover, in the following embodiments, the same reference numbers are used in the drawings and the description to refer to the same or like parts.

Figure 2:
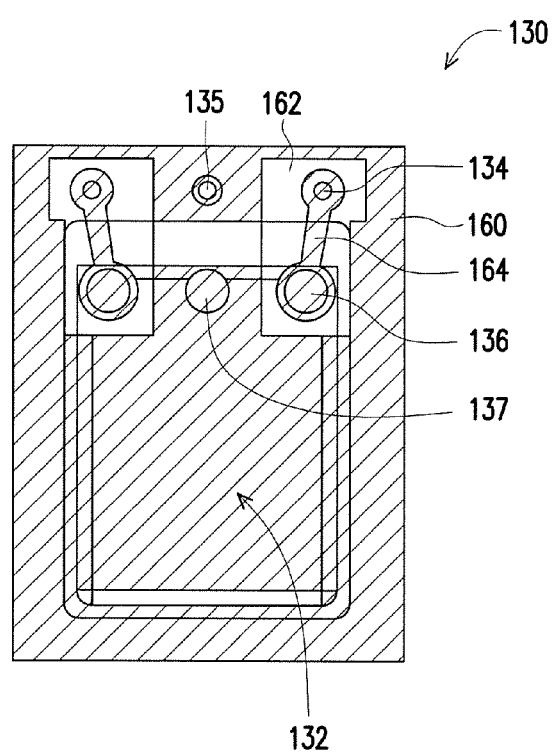
FIG. 2 is a top view of a base according to an embodiment of the disclosure.
Figure 3:
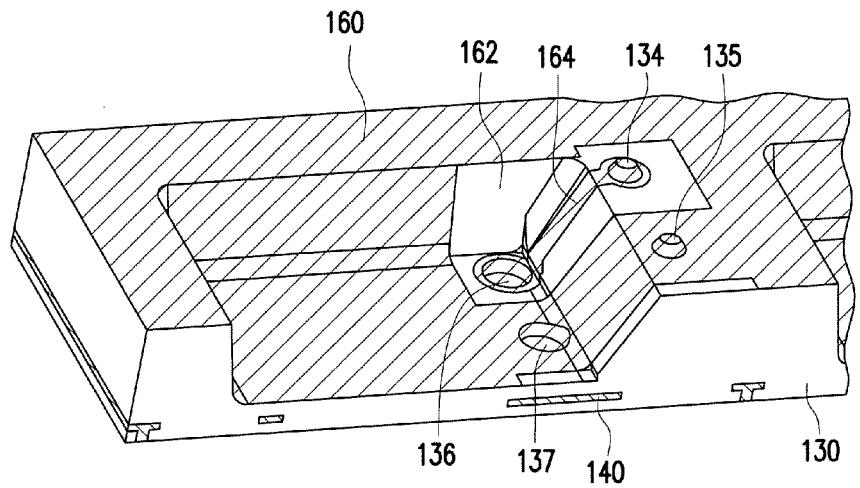
FIG. 3 is a partial cross-sectional view of the base of FIG. 2.

FIG. 1 is a cross-sectional view of a package structure according to an embodiment of the disclosure. FIG. 2 is a top view of a base according to an embodiment of the disclosure. FIG. 3 is a partial cross-sectional view of the base of FIG. 2. Referring to FIG. 1 to FIG. 3, in the present embodiment, the package structure 100 includes a substrate 110, at least one chip 120, a base 130, a first lead frame 150, a first metal layer 170 and a second metal layer 160. The substrate 110 includes a plurality of openings (e.g. openings OP1 shown in FIG. 6 and FIG. 8) and electrode contacts 112. The chip 120 is disposed at a device receiving region of the substrate 110 and is electrically connected to the electrode contacts 112. The electrode contacts 112 are disposed at one side of the device receiving region as that shown in FIG. 1. The base 130 covers the substrate 110 with a bonding surface.

In the present embodiment, the package structure 100 may further include another chip 190, and the chip 190 is disposed on the substrate 110 and is electrically connected to the chip 120. For example, the chip 120 may be a microelectromechanical systems (MEMS) sensor, and the chip 190 may include an application specific integrated circuit (ASIC). Moreover, the package structure 100 may further include a through hole H1, which penetrates through the substrate 110 to expose a part of the chip 120. In the present embodiment, the through hole H1 may be a sound hole of a MEMS microphone package structure. Certainly, the present embodiment is merely an example, and the disclosure does not limit an application range of the package structure 100.

In an embodiment of the disclosure, the base 130 may include a first electrode 134 and a first conductive via 136 as that shown in FIG. 2 and FIG. 3. In the present embodiment, the base 130 may include a receiving cavity 132, the chip 120 may be disposed on the substrate 110 and located in the receiving cavity 132 of the base 130, and the first conductive via 136 may also be set in the receiving cavity 132. The first electrode 134 is disposed on the bonding surface of the base 130 and is fit in with the electrode contact 112 of the substrate 110 for electrical connection as that shown in FIG. 1. Further, an upper surface of the electrode contact 112 of the substrate 110 used for fitting in with the first electrode 134 is lower than a bonding surface of the substrate 110. Correspondingly, the first electrode 134 of the base 130 protrudes out of the bonding surface of the base 130, so as to fit in with the electrode contact 112 for electrical connection. In the present embodiment, the package structure 100 may further include an adhesive material, which may be a non-conductive glue, a conductive glue or a solder past, and disposed between the base 130 and the substrate 110 to adhere the base 130 and the substrate 110.

A second lead frame 140 is embedded in the base 130 as that shown in FIG. 1 and FIG. 3, the first lead frame 150 is embedded in the substrate 110 as that shown in FIG. 1 and is electrically connected to the chip 120 and the electrode contacts 112. The first conductive via 136 penetrates through the base 130 to electrically connect the second lead frame 140. The first lead frame 150 is embedded in the base 110 as that shown in FIG. 1, and is electrically connected to the chip 120 and the electrode contacts 112.

For example, a material of the substrate 110 and/or the base 130 may include a dielectric material such as epoxy, polyester, acrylate, fluorine polymer, polyphenylene oxide, polyimide, phenolic resin, polysulfone, silicon polymer, bismaleimide-triazine modified epoxy resin, cyanate polyester, polyethylene, polycarbonate resin, acrylonitrile-butadiene-styrene copolymer, polyethylene terephthalate (PET), polybutylene terephthalate (PBT), liquid crystal polyester (LCP), polyimide (PA), nylon 6, polyformaldehyde (POM), polyphenylene sulfide (PPS) or cyclic olefin copolymer (COC), etc. In the present embodiment, the material of the base 130 and/or the substrate 110 does not include a metal oxide complex suitable for being activated by laser, plasma or a mechanical cutting tool to implement metallized coating. The metal oxide complex may include, for example, zinc, copper, silver, gold, nickel, palladium, platinum, cobalt, rhodium, iridium, indium, iron, manganese, aluminium, chromium, tungsten, vanadium, tantalum, titanium or any combination thereof.

In the present embodiment, the base 130 and/or the substrate 110 in the package structure 100 may be formed through a molding method, so as to mold the base 130 to cover the second lead frame 140, and mold the substrate 110 to cover the first lead frame 150. Therefore, thickness and shapes of the base 130 and/or the substrate 110 may be freely adjusted according to a product requirement. In this way, a manufacturing process of the package structure 100 of the present embodiment is simplified, design flexibility is improved, and the maximum thickness of the package structure 100 may also be effectively decreased.

In the present embodiment, the second metal layer 160 covers a base surface of the base 130 and includes a first trench 162 and a circuit 164 as that shown in FIG. 2 and FIG. 3. The circuit 164 is connected to the first conductive via 136 and the first electrode 134. The first trench 162 surrounds the first conductive via 136, the first electrode 134 and the circuit 164 connected to the first conductive via 136 and the first electrode 134, such that the first conductive via 136, the first electrode 134 and the circuit 164 are electrically isolated from the rest of the second metal layer 160, where an upper surface of a part of the base 130 exposed by the first trench 162 is lower than the base surface covered by the second metal layer 160. It is noted that the so-called "rest of the second metal layer 160" refers to the second metal layer 160 excludes the part (e.g. the circuit 164) surrounded by the first trench 162.

In the present embodiment, a fabrication method of the second metal layer 160 may include following steps. First, chemical plating is comprehensively performed to a surface of the base 130 to form a metal layer comprehensively covering the base surface. Then, the first trench 162 is carved on the metal layer by using means of laser, plasma or a mechanical cutting tool to form the second metal layer 160, where the first trench 162 bypasses the first conductive via 136, the first electrode 134 and a part of the metal layer connected between the first conductive via 136 and the first electrode 134 to define the circuit 164 connected to the first conductive via 136 and the first electrode 134, and make the first conductive via 136, the first electrode 134 and the circuit 164 to be electrically isolated with the rest of the second metal layer 160. Therefore, since the first trench 162 is carved by using means of laser, plasma or a mechanical cutting tool, an upper surface of a part of the base 130 exposed by the first trench 162 is lower than the base surface covered by the second metal layer 160 due to carving of the laser, the plasma or the mechanical cutting tool. Namely, a step difference exists between the upper surface of a part of the base 130 exposed by the first trench 162 and the base surface covered by the second metal layer 160.

During a process of packaging and using the chip 120, when static electricity is accumulated to a certain degree to produce a discharge phenomenon, the chip is liable to be influence by electrostatic discharge (ESD) and damaged, so that the rest of the second metal layer 160 covers the base surface and is connected to a ground electrode to achieve a grounding/shielding function, so as to decrease the influence of ESD and electromagnetic interference.

In the present embodiment, the package structure 100 may further include a second conductive via 137, and the base 130 may correspondingly include a second electrode 135, where the second electrode 135 is disposed on the bonding surface of the base 130, and is electrically connected to one of the electrode contacts 112. Similarly, the second conductive via 137 is electrically connected to the second lead frame 140, the second metal layer 160 covers the second conductive via 137 and the second electrode 135, and the second conductive via 137 and the second electrode 135 are electrically connected through the second metal layer 160.

For example, in FIG. 2, the electrodes and the conductive vias located on left and right sides are respectively the first electrodes 134 and the first conductive vias 136, and the electrode and the conductive via located in the middle are the second electrode 135 and the second conductive via 137, so that the first trench 162 surrounds the first electrode 134 and the first conductive via 136 located on the left and right sides and does not surround the second electrode 135 and the second conductive via 137 located in the middle, such that the second electrode 135 and the second conductive via 137 are electrically connected through the rest of the second metal layer 160 and may be connected to the ground. Therefore, the second electrode 135 may be a ground electrode of the package structure 100. However, the configuration of the present embodiment is merely for illustration purpose, and the number and configuration of the first electrode 134, the first conductive via 136, the second electrode 135 and the second conductive via 137 are not limited by the disclosure.

Figure 4:
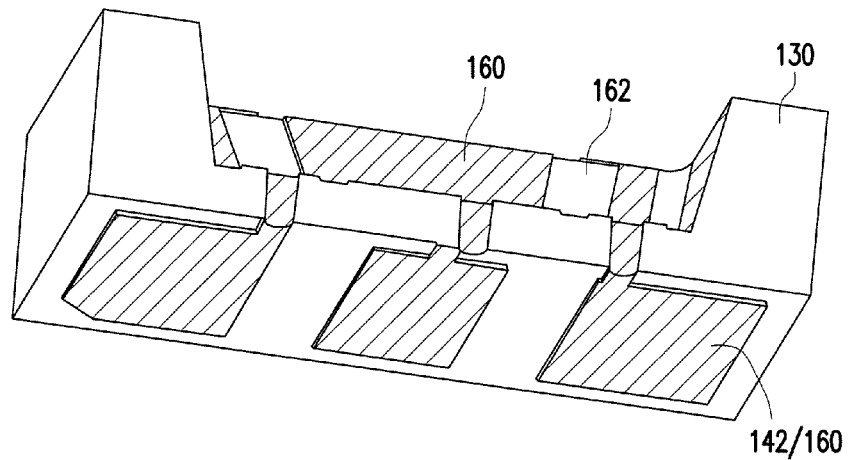
FIG. 4 is another partial cross-sectional view of the base of FIG. 2.
Figure 5:
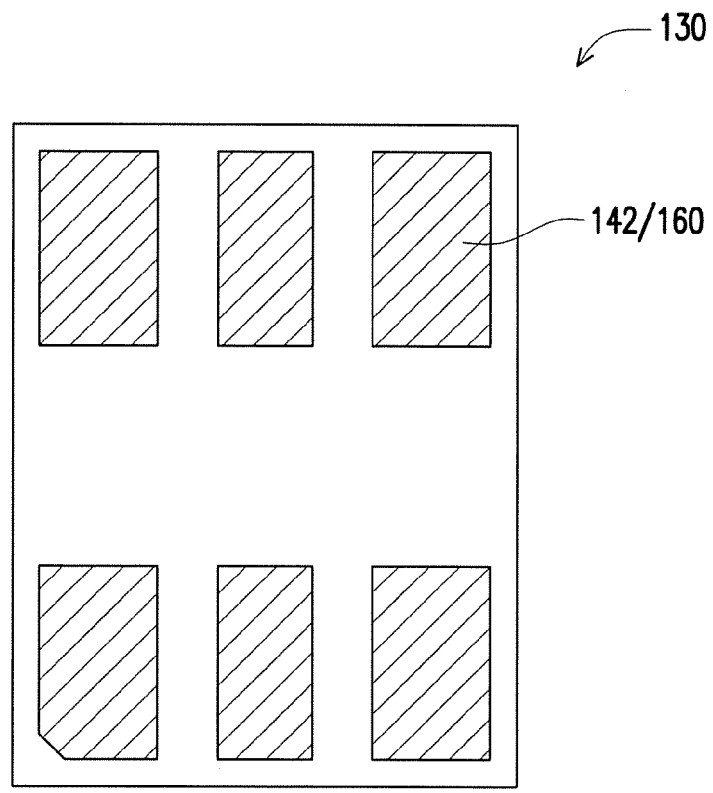
FIG. 5 is a bottom view of the base of FIG. 3.

FIG. 4 is another partial cross-sectional view of the base of FIG. 2. FIG. 5 is a bottom view of the base of FIG. 3. In the present embodiment, the second lead frame 140 may include a plurality of external pads 142 electrically connected to the chip 120, and the external pads 142 are exposed outside the base 130 and are electrically connected to the first conductive via 136 and the second conductive via 137, and the second metal layer 160 may cover the external pads 142. In this way, the package structure 100 may be electrically connected to an external electronic device (for example, a motherboard) through the external pads 142 on the substrate 110. In the present embodiment, the substrate 110 may include a through hole H1 as that shown in FIG. 1, and the through hole H1 penetrates through the substrate 110 and the first lead frame 150 to expose a part of the chip 120. The package structure 100 of the present embodiment may be a MEMS microphone package structure, which may be electrically connected to a motherboard through the external pads 142 on the substrate 110. The through hole H1 may be a sound hole of the MEMS microphone package structure, which may be located on the substrate 110 facing away from the motherboard, so that the present embodiment may be a microphone package structure in a top side sound hole package form. Certainly, the present embodiment is merely an example, and the application range of the package structure 100 is not limited by the disclosure.

In the present embodiment, before the chemical plating is comprehensively performed to the surface of the base 130, an plating resist layer may be first formed, which at least surrounds the external pads 142 (e.g. the part covered by oblique lines shown in FIG. 4), and then the chemical plating is comprehensively performed to the surface of the base 130, such that the second metal layer 160 covers the external pads 142, and the external pads 142 and the rest of the second metal layer 160 are electrically isolated.

In another embodiment, the base 130 may not include the second lead frame 140, and before the chemical plating is comprehensively performed to the surface of the base 130, an plating resist layer is firstly formed on an outer surface of the base 130 facing away from the substrate 110, where the plating resist layer at least surrounds the base 130 at the parts ready to form the external pads 142 (e.g. at the part without covered by the oblique lines in FIG. 5), and then the chemical plating is comprehensively performed to the surface of the base 130 to form the second metal layer 160 including the external pads 142, where the external pads 142 are electrically isolated from the rest of the second metal layer 160. In the present embodiment, the first conductive via 136 and the second conductive via 137 may penetrate through the base 130 to electrically connect the external pads 142.

In an embodiment, a material of the base 130 may include a metal oxide complex suitable for being activated by laser, plasma or a mechanical cutting tool to implement metallized coating. The metal oxide complex includes zinc, copper, silver, gold, nickel, palladium, platinum, cobalt, rhodium, iridium, indium, iron, manganese, aluminium, chromium, tungsten, vanadium, tantalum, titanium or any combination thereof. Therefore, formation of the external pads 142 of the present embodiment may include following steps. First, a path used for forming the external pads is carved on an outer surface of the base 130 facing away from the substrate 110 by laser (for example, the part covered by the oblique lines shown in FIG. 5 are carved by laser), so as to carve a pad trench corresponding to the external pads 142, such that a non-conductive metal complex on the pad trench is deconstructed to release a heavy metal crystal nucleus, which is highly active for reductive metallization. Then, electroplating is selectively performed to the laser-carved base 130, so as to directly perform chemical plating and electroplating to the pad trench to form the external pads 142 shown in FIG. 4 and FIG. 5. Therefore, a surface of the external pads 142 formed according to the aforementioned manufacturing process is lower than the outer surface of the base 130. In the present embodiment, the first conductive via 136 and the second conductive via 137 may penetrate through the base 130 to electrically connect the external pads 142.

In other embodiments, the first lead frame 150 may include the aforementioned external pads, and the external pads are exposed at the back surface of the substrate 110. In this way, the package structure 100 may be electrically connected to an external electronic device (for example, a motherboard) through the external pads on the substrate 100. The structure and manufacturing process of the present embodiment are all similar to the structure and manufacturing method of the aforementioned embodiment.

Figure 6:
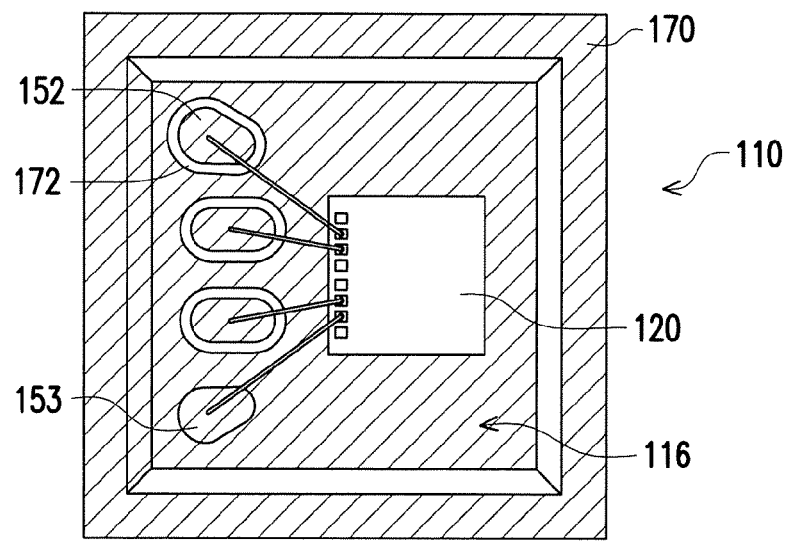
FIG. 6 is a top view of a substrate according to an embodiment of the disclosure.
Figure 7:
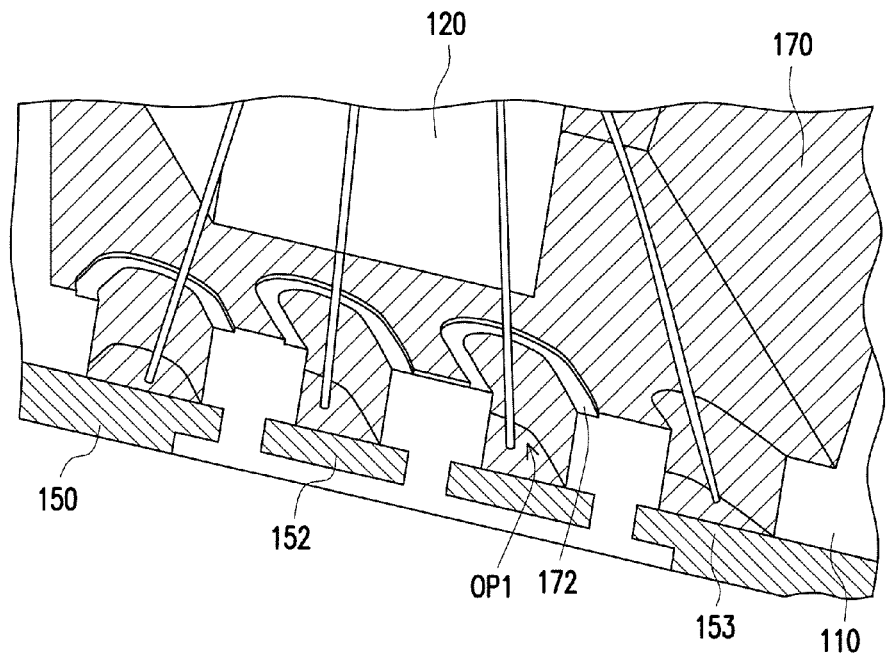
FIG. 7 is a partial cross-sectional view of the substrate of FIG. 6.

FIG. 6 is a top view of a substrate according to an embodiment of the disclosure. FIG. 7 is a partial cross-sectional view of the substrate of FIG. 6. Referring to FIG. 6 and FIG. 7, in the present embodiment, the package structure 100 may further include a first metal layer 170, and the substrate 110 may include a plurality of openings OP1 exposing a plurality of first pads 152 of the first lead frame 150. The first metal layer 170 covers the substrate surface of the substrate 110 and the openings OP1, and the first metal layer 170 may further include a second trench 172 as that shown in FIG. 7, where the second trench 172 respectively surrounds the openings OP1 to electrically isolate the first pads 152 from the rest of the first metal layer 170. The upper surface of a part of the substrate 110 exposed by the second trench 172 is lower than the substrate surface.

In the present embodiment, a manufacturing method of the substrate 110 may include following steps. First, a plurality of the openings OP1 is formed on the substrate 110 by using laser, where the openings OP1 expose a plurality of the first pads 152 of the first lead frame 150. Then, chemical plating is comprehensively performed to the surface of the substrate 110 to form a metal layer comprehensively covering the substrate surface, inner walls of the openings OP1 and the first pads 152. Then, the second trench 172 is carved on the metal layer by using laser, plasma or a mechanical cutting tool, so as to form the first metal layer 170, where the second trench 172 surrounds the openings OP1, such that the first pads 152 and the first metal layer 170 covering the openings OP1 and the first pads 152 are electrically isolated from the rest of the first metal layer 170. The so-called "rest of the first metal layer 170" refers to the first metal layer 170 exclude the part (for example, the first metal layer 170 covering the openings OP1 and the first pads 152) surrounded by the second trench 172.

Since the second trench 172 is carved by using means of laser, plasma or a mechanical cutting tool, an upper surface of the substrate 110 exposed by the second trench 172 is lower than the substrate surface covered by the first metal layer 170 due to carving of the laser, the plasma or the mechanical cutting tool. Therefore, the rest of the first metal layer 170 may be connected to a ground electrode to achieve a grounding/shielding function, so as to decrease the influence of ESD and electromagnetic interference.

In the present embodiment, the first lead frame 150 may further include at least one second pad 153, at least one of the openings OP1 exposes the second pad 153, and the rest of the first metal layer 170 covers the inner wall of the opening OP1 and the second pad 153, such that the second pad 153 is electrically connected to the chip 120 and the rest of the first metal layer 170. For example, the lowermost pad of FIG. 6 is the second pad 153, and the other pads are the first pads 152. Therefore, the second trench 172 may surround the openings OP1 exposing the first pads 152 without surrounding the lowermost second pad 153, such that the second pad 153 is connected to the ground through the rest of the first metal layer 170. However, the configuration of the present embodiment is merely an example, and the number and configuration positions of the first pads 152 and the second pads 153 are not limited by the disclosure.

In the present embodiment, the substrate 110 may further include a device receiving cavity 116, and the chip 120, the first pads 152 and the second pads 153 may all be disposed in the device receiving cavity 116. Under such structure configuration, the base 130 may be a cover plate without having the receiving cavity 132 shown in FIG. 1, and the base 130 covers the substrate 110 and covers the device receiving cavity 116 thereof. The second metal layer 160 of the base 130 may comprehensively cover the surface of the base 130 to provide a shielding effect. Moreover, the chip 120 may be electrically connected to the first pads 152 and the second pads 153 through wire bonding. Certainly, in other embodiments, the chip 120 may also be electrically connected to the first pads 152 and the second pads 153 through flip-chip bonding.

Figure 8:
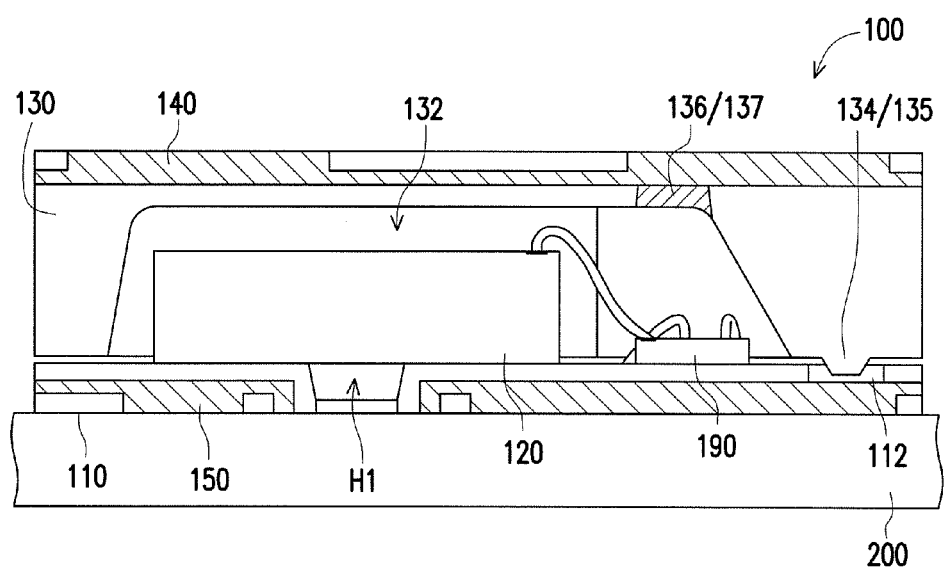
FIG. 8 is a cross-sectional view of a package structure according to an embodiment of the disclosure.
Figure 9:
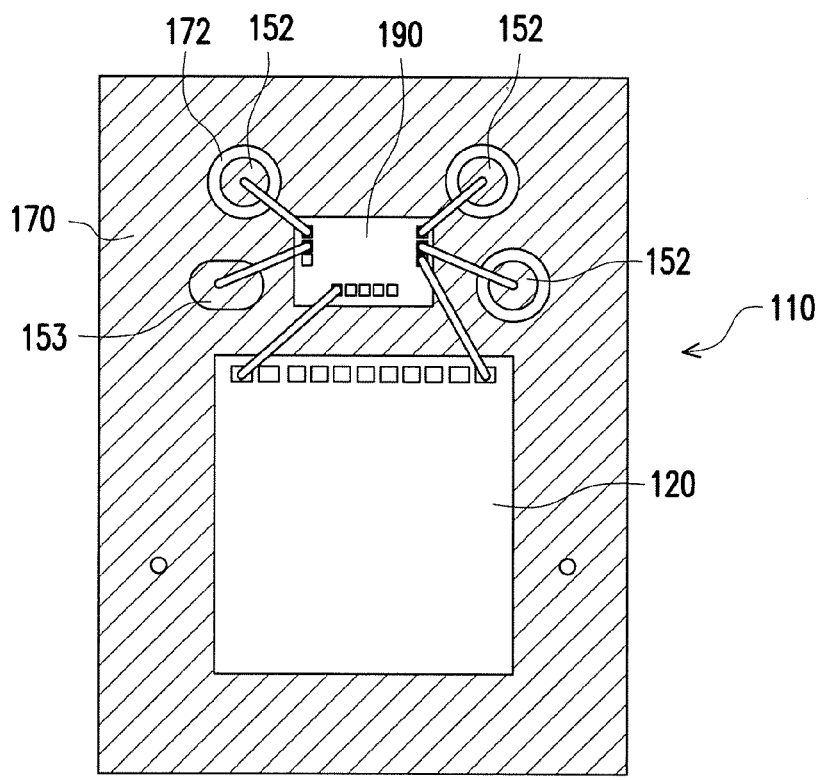
FIG. 9 is a top view of a substrate according to an embodiment of the disclosure.
Figure 10:
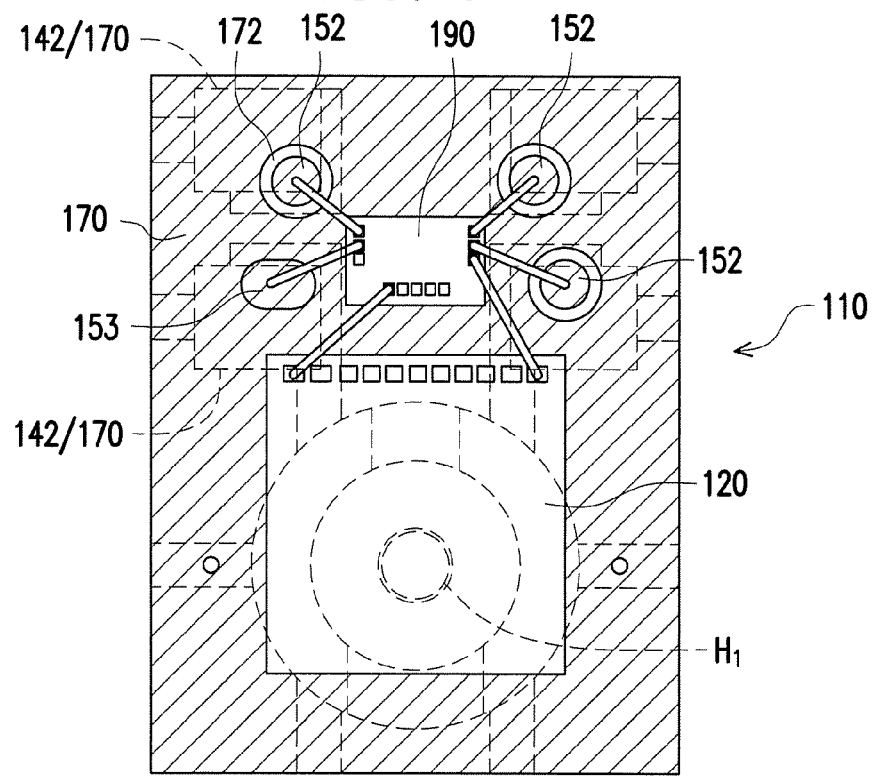
FIG. 10 is a perspective view of the substrate of FIG. 9.

FIG. 8 is a cross-sectional view of a package structure according to an embodiment of the disclosure. FIG. 9 is a top view of a substrate according to an embodiment of the disclosure. FIG. 10 is a perspective view of the substrate of FIG. 9. It should be noted that that the substrate 110 of the present embodiment is similar to the substrate 110 of FIG. 6 and FIG. 7, so that the device referential numbers and a part of content of the aforementioned embodiment are also used in the present embodiment, where the same referential numbers are used to denote the same or similar devices, and description of the same technical content thereof are omitted. The description of the omitted part may refer to the aforementioned embodiment, and detail thereof is not repeated. Referring to FIG. 8 and FIG. 10, differences between the substrate 110 of the present embodiment and the substrate 110 of FIG. 6 and FIG. 7 are described below.

In the present embodiment, the substrate 110 may not have the device receiving cavity 116 shown in FIG. 6, and the chips 120 and 190 are all disposed on the substrate 110. The chip 190 may be electrically connected to the first pads 152 and the second pads 153 through wire bonding, and the chip 120 may be electrically connected to the chip 190 through wire bonding, so as to electrically connect the first pads 152 and the second pads 153. Certainly, the present embodiment is merely an example, and the disclosure is not limited thereto, and in other embodiments, the chips 120 and 190 may also be electrically connected to the first pads 152 and the second pads 153 through flip-chip bonding.

In the present embodiment, the first lead frame 150 may include a plurality of external pads 142, and the external pads 142 are electrically connected to the chip 120 and exposed outside the substrate 110. In this way, the package structure 100 may be electrically connected to an external electronic device 200 through the external pads 142 on the substrate 110 as that shown in FIG. 8 and FIG. 10. Under such configuration, the substrate 110 may include a through hole H1 as that shown in FIG. 8, and the through hole H1 penetrates through the substrate 110 and the first lead frame 150 to expose a part of the chip 120. Therefore, the package structure 100 of the present embodiment may be a MEMS microphone package structure, which may be electrically connected to the external electronic device 200 through the external pads 142 on the substrate 110. The through hole H1 may be a sound hole of the MEMS microphone package structure, which may be located on the substrate 110 facing the external electronic device 200, so that the present embodiment may be a microphone package structure in a underside sound hole package form. Certainly, the present embodiment is merely an example, and the application range of the package structure 100 is not limited by the disclosure.

In the present embodiment, before the chemical plating is comprehensively performed to the surface of the substrate 110, an plating resist layer may be first formed on an outer surface of the substrate 110 facing away from the base 130, and the plating resist layer at least surrounds the substrate 110 at the parts ready to form the external pads 142, and then the chemical plating is comprehensively performed to the surface of the substrate 110 to form the first metal layer 170 including the external pads 142, where the external pads 142 are electrically isolated from the rest of the first metal layer 170. In the present embodiment, the external pads 142 may be electrically connected to the first lead frame 150.

In the present embodiment, a material of the substrate 110 may include a metal oxide complex suitable for being activated by laser, plasma or a mechanical cutting tool to implement metallized coating. The metal oxide complex includes zinc, copper, silver, gold, nickel, palladium, platinum, cobalt, rhodium, iridium, indium, iron, manganese, aluminium, chromium, tungsten, vanadium, tantalum, titanium or any combination thereof. Therefore, formation of the external pads 142 of the present embodiment may include following steps. First, a path used for forming the external pads is carved on an outer surface of the substrate 110 facing away from the base 130 by laser, so as to carve a pad trench corresponding to the external pads 142, such that a non-conductive metal complex on the pad trench is deconstructed to release a heavy metal crystal nucleus, which is highly active for reductive metallization. Then, electroplating is selectively performed to the laser-carved substrate 110 to directly perform chemical plating and electroplating to the pad trench to form the external pads 142 shown in FIG. 10. Therefore, a surface of the external pads 142 formed according to the aforementioned manufacturing process is lower than the outer surface of the substrate 110. In the present embodiment, the external pads 142 may be electrically connected to the first lead frame 150.

Figure 11:
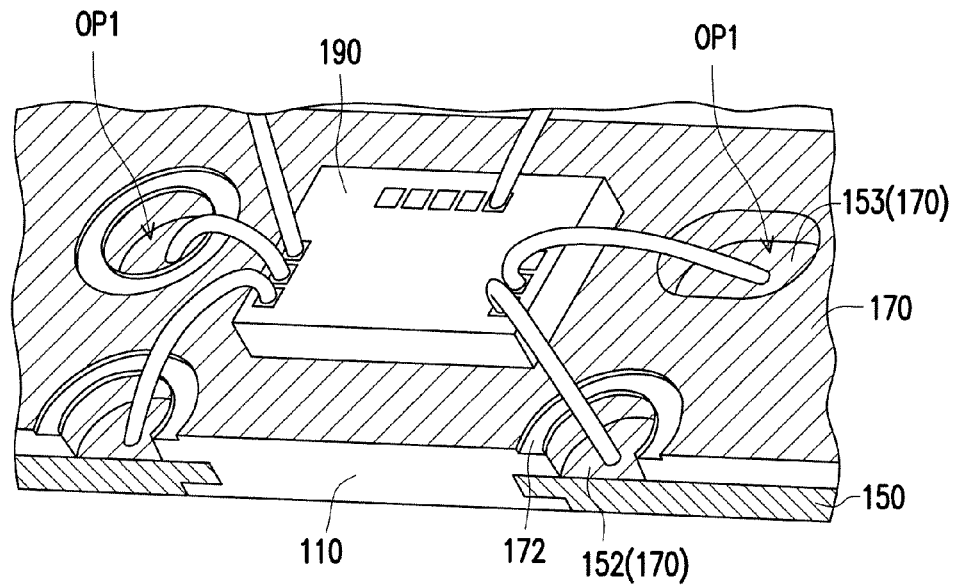
FIG. 11 is a partial cross-sectional view of the substrate of FIG. 9.
Figure 12:
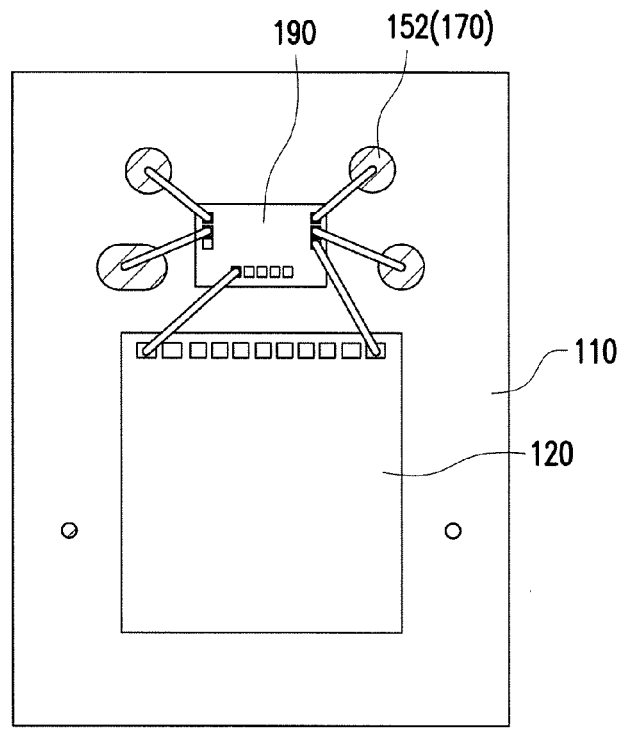
FIG. 12 is a top view of a substrate according to an embodiment of the disclosure.
Figure 13:
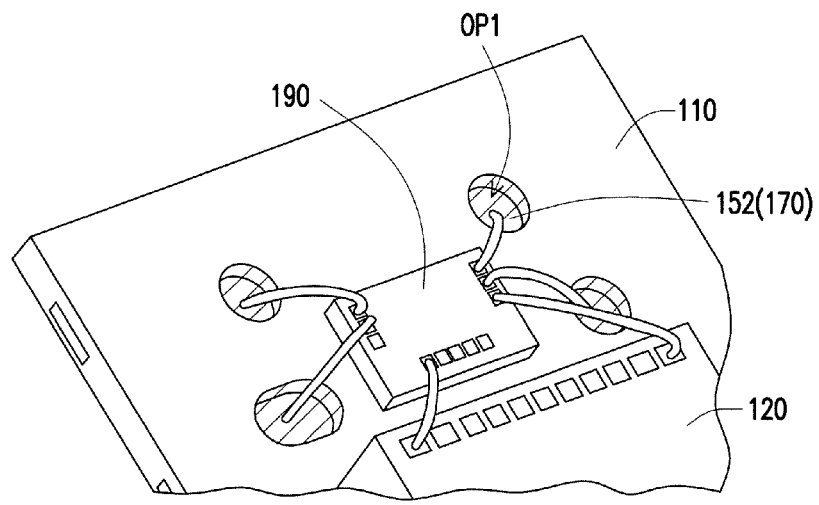
FIG. 13 is a partial enlarged view of the substrate of FIG. 12.

FIG. 12 is a top view of a substrate according to an embodiment of the disclosure. FIG. 13 is a partial enlarged view of the substrate of FIG. 12. It should be noted that that the substrate 110 of the present embodiment is similar to the substrate 110 of FIG. 9 to FIG. 11, so that the device referential numbers and a part of content of the aforementioned embodiment are also used in the present embodiment, where the same referential numbers are used to denote the same or similar devices, and description of the same technical content thereof are omitted. The description of the omitted part may refer to the aforementioned embodiment, and detail thereof is not repeated. Referring to FIG. 12 and FIG. 13, differences between the substrate 110 of the present embodiment and the substrate 110 of FIG. 9 to FIG. 11 are described below.

In the present embodiment, the substrate 110 may include a plurality of openings OP1, where the openings OP1 expose a plurality of first pads 152 of the first lead frame 150, and the first metal layer 170 covers the openings OP1 and the first pads 152. In the present embodiment, a manufacturing method of the substrate 110 may include following steps. First, a plurality of openings OP1 is formed on the substrate 110 by laser, where the openings OP1 expose a plurality of first pads 152 of the first lead frame 150. Then, electroplating is performed to the first pads 152 exposed by the openings OP1 to form the first metal layer 170 covering the first pads 152. Then, the chip 190 is electrically connected to the first pads 152 and the second pads 153 through wire bonding, and the chip 120 is electrically connected to the chip 190 through wire bonding. Certainly, the present embodiment is merely an example, and the disclosure is not limited thereto, and in other embodiments, the chip 120 and the chip 190 may also be electrically connected to the first pads 152 and the second pads 153 through flip-chip bonding.

Figure 14:
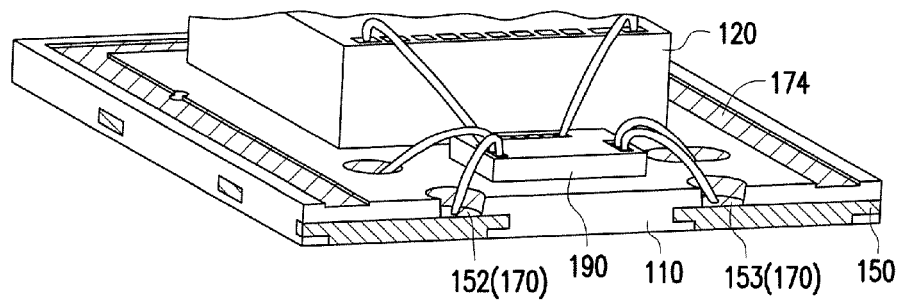
FIG. 14 is a partial cross-sectional view of a substrate according to an embodiment of the disclosure.

FIG. 14 is a partial cross-sectional view of a substrate according to an embodiment of the disclosure. It should be noted that that the substrate 110 of the present embodiment is similar to the substrate 110 of FIG. 12 and FIG. 13, so that the device referential numbers and a part of content of the aforementioned embodiment are also used in the present embodiment, where the same referential numbers are used to denote the same or similar devices, and description of the same technical content thereof are omitted. The description of the omitted part may refer to the aforementioned embodiment, and detail thereof is not repeated. Referring to FIG. 14, differences between the substrate 110 of the present embodiment and the substrate 110 of FIG. 12 and FIG. 13 are described below.

In the present embodiment, the first metal layer 170 may include a ground ring 174, and the ground ring 174 surrounds a periphery of the substrate 110 and may be connected to the ground electrode. In the present embodiment, the substrate 110 may include the second pad 153 electrically connected to the chip 120 and the chip 190, the first metal layer 170 covers the first pads 152 and the second pad 153, and the second pad 153 is electrically connected to the ground ring 174.

In the present embodiment, a material of the substrate 110 may include a metal oxide complex suitable for being activated by laser, plasma or a mechanical cutting tool to implement metallized coating. The metal oxide complex includes zinc, copper, silver, gold, nickel, palladium, platinum, cobalt, rhodium, iridium, indium, iron, manganese, aluminium, chromium, tungsten, vanadium, tantalum, titanium or any combination thereof. Therefore, formation of the first metal layer 170 of the present embodiment may include following steps. First, a circuit trench corresponding to the ground ring 174 is carved on the substrate 110 by laser along a path used for forming the first metal layer 170 (for example, at the ground ring 174 surrounding the periphery of the substrate 110), such that a non-conductive metal complex on the circuit trench is deconstructed to release a heavy metal crystal nucleus, which is highly active for reductive metallization. Then, electroplating is selectively performed to the laser-carved substrate 110 to directly perform chemical plating and electroplating to the circuit trench to form the first metal layer 170 (for example, the ground ring 174 surrounding the periphery of the substrate 110). Therefore, a lower surface of the first metal layer 170 formed according to the aforementioned manufacturing process is lower than the surface of the substrate 110. In the present embodiment, a part of the first metal layer 170 covering the first pads 152 and the second pad 153 may be formed through direct electroplating, and the ground ring 174 directly formed on the substrate 110 is formed by chemical plating and electroplating through the aforementioned laser activation process.

Figure 15:
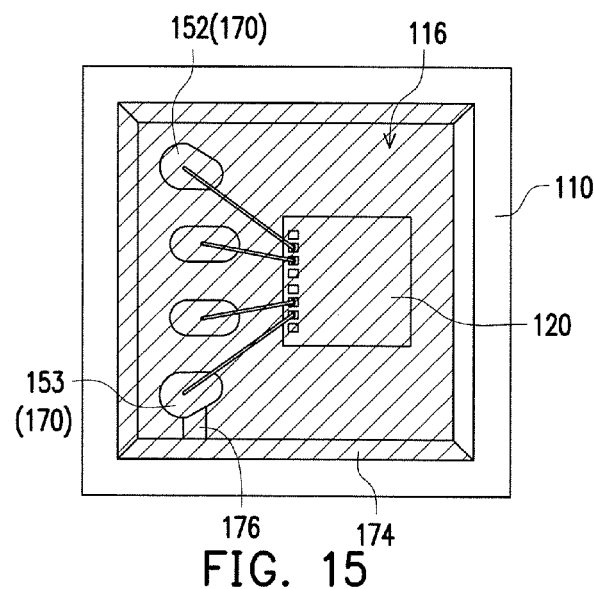
FIG. 15 is a top view of a substrate according to an embodiment of the disclosure.
Figure 16:
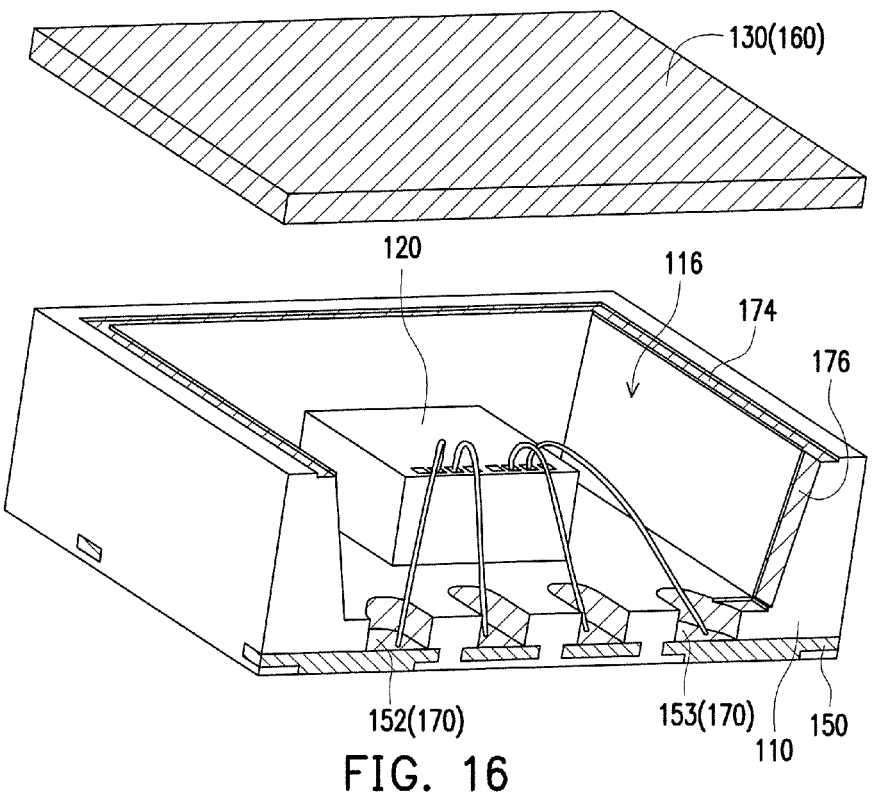
FIG. 16 is a partial cross-sectional view of the substrate of FIG. 15.

FIG. 15 is a top view of a substrate according to an embodiment of the disclosure. FIG. 16 is a partial cross-sectional view of the substrate of FIG. 15. It should be noted that that the substrate 110 of the present embodiment is similar to the substrate 110 of FIG. 14, so that the device referential numbers and a part of content of the aforementioned embodiment are also used in the present embodiment, where the same referential numbers are used to denote the same or similar devices, and description of the same technical content thereof are omitted. The description of the omitted part may refer to the aforementioned embodiment, and detail thereof is not repeated. Referring to FIG. 15 and FIG. 16, differences between the substrate 110 of the present embodiment and the substrate 110 of FIG. 14 are described below.

In the present embodiment, the substrate 110 further includes a device receiving cavity 116, and the chip 120, the first pads 152 and the second pads 153 are all disposed in the device receiving cavity 116. The first metal layer 170 includes the ground ring 174 and a ground circuit 176, where the first metal layer 170 covers the first pads 152 and the second pads 153, the ground ring 174 surrounds the periphery of the substrate 110 and may be connected to the ground electrode, and the ground circuit 176 is electrically connected to the second pads 153 and the ground ring 174. Further, the ground circuit 176 may extend on an inner wall of the device receiving cavity 116 as that shown in FIG. 16 to connect the second pad 153 and the ground ring 174. Under such structure configuration, the base 130 may be a cover plate without having the receiving cavity 132 of FIG. 1 as that shown in FIG. 16, and the base 130 covers the substrate 110 and covers the device receiving cavity 116 thereof. The second metal layer 160 of the base 130 may comprehensively cover the surface of the base 130 to provide a shielding effect.

In the present embodiment, a material of the substrate 110 may include a metal oxide complex suitable for being activated by laser, plasma or a mechanical cutting tool to implement metallized coating. Therefore, formation of the first metal layer 170 of the present embodiment may include following steps. First, a circuit trench corresponding to the ground ring 174 and the ground circuit 176 is carved on the substrate 110 by laser along a path used for forming the first metal layer 170 (for example, a path of the ground ring 174 and the ground circuit 176), such that a non-conductive metal complex on the circuit trench is deconstructed to release a heavy metal crystal nucleus, which is highly active for reductive metallization. Then, electroplating is selectively performed to the laser-carved substrate 110 to directly perform chemical plating and electroplating to the circuit trench to form the first metal layer 170 (for example, the ground ring 174 and the ground circuit 176). Therefore, a lower surface of the first metal layer 170 formed according to the aforementioned manufacturing process is lower than the surface of the substrate 110. Moreover, in the present embodiment, a part of the first metal layer 170 covering the first pads 152 and the second pad 153 may be formed through direct electroplating, and the ground ring 174 directly formed on the substrate 110 is formed by chemical plating and electroplating through the aforementioned laser activation process.

In summary, in view of the package structure of the disclosure, a laser is first adopted to form a plurality of openings on the substrate to expose a plurality of pads of the lead frame embedded in the substrate, such that the chip disposed on the substrate may be electrically connected to the exposed pads. Therefore, according to the embodiment of the disclosure, the manufacturing process of the package structure may be effectively simplified to improve process efficiency. Moreover, the package structure formed based on the above manufacturing process is unnecessary to add a metal oxide that may be activated by laser, plasma or mechanical cutting tool in the base and/or the substrate, such that production cost may be decreased.

Besides, the base and the substrate of the disclosure may be shaped through a molding method, so that a thickness thereof and a shape thereof have larger design flexibility, and the thickness of the base/substrate may be easily controlled to be under 100 µm. Therefore, regarding the package structure of the disclosure, not only design flexibility thereof is improved, it may also easily comply with a fine circuit standard, and process steps may be effectively simplified and the production cost and the overall thickness of the package structure are decreased.

It will be apparent to those skilled in the art that various modifications and variations may be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A package structure, comprising:
    a substrate, comprising a plurality of openings;
    a first lead frame, embedded in the substrate, and comprising a plurality of first pads, wherein the openings expose the first pads;
    a first metal layer, covering the exposed first pads;
    at least one chip, disposed on the substrate, and electrically connected to the first metal layer and the first pads;
    a base, covering the substrate with a bonding surface; and
    a second metal layer, covering a base surface of the base.

2. The package structure as claimed in claim 1, wherein the base further comprises a receiving cavity, and the chip is located in the receiving cavity.

3. The package structure as claimed in claim 1, wherein a material of the base and the substrate comprises epoxy, diallyl phthalate (DAP), benzocyclobutene (BCB), polyester, acrylate, fluorine polymer, polyphenylene oxide, polyimide, phenolic resin, polysulfone, silicon polymer, bismaleimide-triazine modified epoxy resin, cyanate polyester, polyethylene, polycarbonate resin, acrylonitrile-butadiene-styrene copolymer, polyethylene terephthalate (PET), polybutylene terephthalate (PBT), liquid crystal polyester (LCP), polyamide (PA), nylon 6, polyformaldehyde (POM), polyphenylene sulfide (PPS), polycarbonate (PC), polymethacrylate (PMMA), acrylonitrile butadiene styrene (ABS) resin or cyclic olefin copolymer (COC).

4. The package structure as claimed in claim 1, wherein a material of the base and the substrate does not comprise a metal oxide complex suitable for being activated by laser, plasma or a mechanical cutting tool to implement metallized coating.

5. The package structure as claimed in claim 1, further comprising:
    a second lead frame, embedded in the base, and comprising a plurality of external pads electrically connected to the chip and exposed outside the base.

6. The package structure as claimed in claim 1, wherein the substrate further comprises a plurality of electrode contacts, and the base comprises a first electrode and a first conductive via, and the first electrode is disposed on the bonding surface and electrically connected to the electrode contacts.

7. The package structure as claimed in claim 6, wherein the second metal layer comprises a first trench and a circuit, the circuit is connected to the first conductive via and the first electrode, the first trench surrounds the first conductive via, the first electrode and the circuit, such that the first conductive via, the first electrode and the circuit are electrically isolated from the rest of the second metal layer, wherein an upper surface of a part of the base exposed by the first trench is lower than the base surface.

8. The package structure as claimed in claim 6, wherein the second metal layer further comprises a plurality of external pads disposed on an outer surface of the base facing away from the substrate and electrically connected to the first conductive via.

9. The package structure as claimed in claim 8, wherein a surface of the external pads is lower than the outer surface of the base.

10. The package structure as claimed in claim 1, wherein the substrate further comprises a through hole penetrating through the substrate and the first lead frame to expose a part of the chip.

11. The package structure as claimed in claim 6, wherein the base further comprises a second conductive via and a second electrode, the second electrode is disposed on the bonding surface and electrically connected to one of the electrode contacts, the second conductive via is electrically connected to the second electrode, and the rest of the second metal layer covers and electrically connects the second conductive via and the second electrode.

12. The package structure as claimed in claim 6, wherein the rest of the second metal layer is connected to a ground electrode.

13. The package structure as claimed in claim 1, wherein the first metal layer covers a substrate surface of the substrate and the openings, and comprises a plurality of second trenches respectively surrounding the openings, such that the first pads are electrically isolated from the rest of the first metal layer, wherein an upper surface of a part of the substrate exposed by the second trench is lower than the substrate surface.

14. The package structure as claimed in claim 1, wherein the first lead frame comprises a plurality of external pads electrically connected to the chip and exposed outside the substrate.

15. The package structure as claimed in claim 1, wherein the first metal layer further comprises a plurality of external pads disposed on an outer surface of the substrate facing away from the base and electrically connected to the chip.

16. The package structure as claimed in claim 1, wherein the substrate further comprises a device receiving cavity, and the chip and the first pads are disposed in the device receiving cavity.

17. The package structure as claimed in claim 13, wherein the rest of the first metal layer is connected to a ground electrode.

18. The package structure as claimed in claim 1, wherein the chip is electrically connected to the first pads through wire bonding.

19. The package structure as claimed in claim 1, wherein the chip is electrically connected to the first pads through flip-chip bonding.

20. The package structure as claimed in claim 1, wherein the first lead frame further comprises a second pad, one of the openings exposes the second pad, and the second pad is electrically connected to the chip and the rest of the first metal layer.

21. The package structure as claimed in claim 1, wherein the first metal layer further comprises a ground ring and a ground circuit, the ground ring surrounds a periphery of the substrate, the first lead frame further comprises a second pad electrically connected to the chip, and the ground circuit is electrically connected to the second pad and the ground ring.

22. The package structure as claimed in claim 21, wherein the substrate further comprises a device receiving cavity, the chip, the first pads and the second pad are disposed in the device receiving cavity, the ground ring surrounds the device receiving cavity, and the ground circuit extends on an inner wall of the device receiving cavity to connect the second pad and the ground ring.

23. The package structure as claimed in claim 1, wherein a material of the base or the substrate comprises a metal oxide complex suitable for being activated by laser, plasma or a mechanical cutting tool to implement metallized coating.

24. The package structure as claimed in claim 23, wherein a material of the metal oxide complex comprises zinc, copper, silver, gold, nickel, palladium, platinum, cobalt, rhodium, iridium, indium, iron, manganese, aluminium, chromium, tungsten, vanadium, tantalum, titanium or any combination thereof.

25. The package structure as claimed in claim 23, wherein a lower surface of the first metal layer is lower than a substrate surface of the substrate.

* * * * *